United States Patent
Guy et al.

(10) Patent No.: US 10,998,064 B2
(45) Date of Patent: May 4, 2021

(54) RESISTIVE RANDOM ACCESS MEMORY PROGRAM AND ERASE TECHNIQUES AND APPARATUS

(71) Applicant: Crossbar, Inc., Santa Clara, CA (US)

(72) Inventors: Jeremy Guy, San Jose, CA (US); Sung Hyun Jo, Sunnyvale, CA (US); Hagop Nazarian, San Jose, CA (US); Ruchirkumar Shah, San Jose, CA (US); Liang Zhao, Santa Clara, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 16/291,467

(22) Filed: Mar. 4, 2019

(65) Prior Publication Data
US 2019/0272882 A1 Sep. 5, 2019

Related U.S. Application Data

(60) Provisional application No. 62/638,526, filed on Mar. 5, 2018.

(51) Int. Cl.
*G11C 16/34* (2006.01)
*G11C 16/16* (2006.01)
(Continued)

(52) U.S. Cl.
CPC ...... *G11C 16/3445* (2013.01); *G11C 11/5678* (2013.01); *G11C 13/004* (2013.01);
(Continued)

(58) Field of Classification Search
CPC ............ G11C 16/3445; G11C 16/3418; G11C 11/5678; G11C 13/004; G11C 13/0069; G11C 16/16; G11C 16/26
See application file for complete search history.

(56) References Cited

U.S. PATENT DOCUMENTS

| 9,053,786 B2 | 6/2015 | Ichihara et al. |
| 2008/0137436 A1* | 6/2008 | Salter ................. G11C 16/3418 365/185.24 |

(Continued)

FOREIGN PATENT DOCUMENTS

| KR | 10-2010-0106238 | 10/2010 |
| KR | 10-2013-0119493 | 10/2013 |

(Continued)

OTHER PUBLICATIONS

Notice of Allowance for corresponding Korean Patent Application No. 10-2019-0025308 filed Mar. 5, 2019, dated Oct. 7, 2020 (3 pages long).

(Continued)

*Primary Examiner* — David Lam
(74) *Attorney, Agent, or Firm* — Wegman Hessler

(57) ABSTRACT

A method for erasing a memory cell includes applying a first erase to memory cells to erase the memory cells, wherein first memory cells are in a weakly erased state in response to the first erase, and wherein second memory cells are in a normally erased state in response to the first erase, thereafter applying a first weak program to the memory cells, wherein the second memory cells enter a programmed state and the third memory cells remain in the erased state in response to the first weak program, and thereafter applying a read to the memory cells to identify the second memory cells, and applying a second erase to the second memory cells to thereby erase the second memory cells.

20 Claims, 12 Drawing Sheets

(51) Int. Cl.
*G11C 16/26* (2006.01)
*G11C 11/56* (2006.01)
*G11C 13/00* (2006.01)

(52) U.S. Cl.
CPC .......... *G11C 13/0069* (2013.01); *G11C 16/16* (2013.01); *G11C 16/26* (2013.01)

(56) References Cited

U.S. PATENT DOCUMENTS

| | | |
|---|---|---|
| 2009/0010039 A1 | 1/2009 | Tokiwa et al. |
| 2012/0188813 A1 | 7/2012 | Chien et al. |
| 2019/0252029 A1* | 8/2019 | Lai .................. G11C 16/16 |

FOREIGN PATENT DOCUMENTS

| | | |
|---|---|---|
| TW | 201232543 | 8/2012 |
| TW | 201539707 | 10/2015 |

OTHER PUBLICATIONS

Office Action for corresponding Korean Patent Application No. 10-2019-0025308 filed Mar. 5, 2019, dated Feb. 7, 2020 (11 pages long).
Examination Report for corresponding Taiwan Patent Application No. 108107243 dated Jan. 19, 2021, 14 pages long.

* cited by examiner

INITIAL STATE

GOOD E/P

MARGINAL E/P

INITIAL STATE

GOOD E/P

MARGINAL E/P

RESISTIVE RANDOM ACCESS MEMORY PROGRAM AND ERASE TECHNIQUES AND APPARATUS

CROSS-REFERENCE TO RELATED APPLICATION

The present application for patent claims the benefit of U.S. Provisional Application No. 62/638,526 filed on Mar. 5, 2018 and titled "RESISTIVE RANDOM ACCESS MEMORY ERASE TECHNIQUES AND APPARATUS", which is hereby incorporated by reference herein in its entirety and for all purposes.

TECHNICAL FIELD

The present disclosure relates to improving performance of memory devices; for example, embodiments presented herein disclose apparatus(es) and method(s) for improving retention of memory devices.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with measurably distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell can be correlated with logical information states, facilitating digital memory operations. Accordingly, the inventor(s) believe that arrays of many such memory cells can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to memory applications for electronic devices. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, continued development of practical utilizations of resistive-switching technology are pursued by the Assignee of the present disclosure.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The present disclosure provides for improved program and erase techniques and apparatuses for improving performance and longevity of two-terminal memory cell. The various techniques include performing a memory operation on a group of such memory cells, followed by a weak reverse operation. A read operation can be implemented to determine if the weak reverse operation changed an intended result of the memory operation for any of the group of memory cells. If so, the memory operation is repeated on those memory cells determined that were changed in response to the weak reverse operation. A subsequent weak reverse operation (and read verify) can be implemented to determine that the repeated memory operation was successful.

In some embodiments, a dummy operation can be implemented, following a second memory operation and weak reverse operation. The dummy operation can strongly program (or strongly erase) a memory cell whose resistance state was at least in part marginalized by the second weak reverse operation. A marginalized memory cell can be one that is at risk of losing its memory state and might occur in response to the weak reverse operation. The dummy operation can, in some embodiments, correct the marginalization of such a memory cell(s). A further verification can be implemented following the dummy operation, in such embodiments.

According to one aspect of the disclosure, a method for erasing a memory cell is disclosed. One method includes applying a first erase process to a first plurality of memory cells to thereby erase each memory cell from the first plurality of memory cells, wherein a second plurality of memory cells from the first plurality of memory cells are in a weakly erased state in response to the first erase process, and wherein a third plurality of memory cells from the first plurality of memory cells are in a normally erased state in response to the first erase process; and thereafter applying a first weak programming process to the first plurality of memory cells that have been erased, wherein memory cells from the second plurality of memory cells are programmed to a programmed state in response to the first weak programming process, and wherein memory cells from the third plurality of memory cells remain in the normally erased state in response to the first weak programming process. A technique may include applying a first read process to the first plurality of memory cells to identify the second plurality of memory cells from the first plurality of memory cells that are in the programmed state in response to the first weak programming process, and applying a second erase process to the second plurality of memory cells to thereby erase each memory cell from the second plurality of memory cells.

According to another aspect of the disclosure, a memory device is described. One apparatus includes a first plurality of memory devices, wherein each memory device from the first plurality of memory devices is associated with one state of a plurality of states including a programmed state and an unprogrammed state; and a programming circuit coupled to the first plurality of memory devices, wherein the programming circuit is configured to apply a regular programming process to the first plurality of memory cells, wherein the first plurality of memory cells change state from the unprogrammed state to the programmed state in response to the regular programming process, wherein the programming circuit is also configured to apply a first weak programming process to the first plurality of memory cells, wherein a second plurality of memory devices from the first plurality of memory devices change state from the unprogrammed state to the programmed state in response to the first weak programming process, and wherein a third plurality of memory devices from the first plurality of memory devices remain in the unprogrammed state in response to the first weak programming process. A device may include a read circuit coupled to the first plurality of memory devices, wherein the read circuit is configured to apply a read voltage to the first plurality of memory cells to determine memory cells of the second plurality of memory cells that are in the programmed state; and an erase circuit coupled to the first plurality of memory devices, wherein the erase circuit is configured to apply an erase process to the second plurality of memory cells, wherein the second plurality of memory cells change state from the programmed state to the unprogrammed state, in response to the erase process.

According to yet another aspect of the disclosure, an electronic device is disclosed. One device may include a programming circuit configured to provide a weak programming signal; and a memory cell coupled to the programming circuit, wherein the memory cell is characterized by a plurality of states comprising a programmed state, a weak unprogrammed state, and a regular unprogrammed state, wherein when in the weak unprogrammed state, the memory cell is configured to enter the programmed state in response to the weak programming signal, and when in the regular unprogrammed state, the memory cell is configured to maintain the regular unprogrammed state in response to the weak programming signal. An apparatus may include a read circuit coupled to the memory cell, wherein the read circuit is configured to apply a read voltage to the memory cell to thereby determine a state of the memory device; and an erase circuit coupled to the memory cell, wherein the erase circuit is configured to apply a first erase signal to the memory cell to cause the memory cell to change states from the programmed state to the weak unprogrammed state.

In a further embodiment, disclosed is a method for erasing two-terminal memory cells. The method can comprise applying a first erase process to a plurality of two-terminal memory cells and applying a first read process to verify the plurality of cells are erased. Further, the method can comprise applying a weak program process to the plurality of two-terminal memory cells and applying a second read process to determine if any of the plurality of cells is programmed in response to the weak program process. If one or more program cells are determined, a second erase process can be applied to a subset of the plurality of cells determined to be programmed.

In still another embodiment, disclosed is a method for programming two-terminal memory cells. The method can comprise applying a first program process to a plurality of two-terminal memory cells and applying a first read process to verify the plurality of cells are programmed. Further, the method can comprise applying a weak erase process to the plurality of two-terminal memory cells and applying a second read process to determine if any of the plurality of cells is erased in response to the weak erase process. If one or more erase cells are determined, a second program process can be applied to a subset of the plurality of cells determined to be erased.

In another embodiment, disclosed is a method for improved erasing of two-terminal memory cells. The method can comprise applying a first erase process to a plurality of two-terminal memory cells, and applying a first read process to verify the plurality of cells is erased. A weak program process can be applied to the plurality of cells and a second read process to determine if any of the plurality cells has become programmed in response to the weak program process. In response to discovering a portion of the cells to be programmed, the method can comprise applying a second erase process to the portion of the cells that are programmed. Subsequently, a second weak program process is performed on the portion of the cells, and a dummy erase process is applied to the plurality of the cells following the second weak program process. A third read process can optionally be performed to verify that each of the plurality of the two-terminal memory cells is erased.

In another embodiment, disclosed is a method for improved programming of two-terminal memory cells. The method can comprise applying a first program process to a plurality of two-terminal memory cells, and applying a first read process to verify the plurality of cells is programmed. A weak erase process can be applied to the plurality of cells and a second read process to determine if any of the plurality cells has become erased in response to the weak erase process. In response to discovering a portion of the cells to be erased, the method can comprise applying a second program process to the portion of the cells that are erased. Subsequently, a second weak erase process is performed on the portion of the cells, and then a dummy program process is applied to the plurality of the cells following the second weak erase process. A third read process can optionally be performed to verify that each of the plurality of the two-terminal memory cells is programmed.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
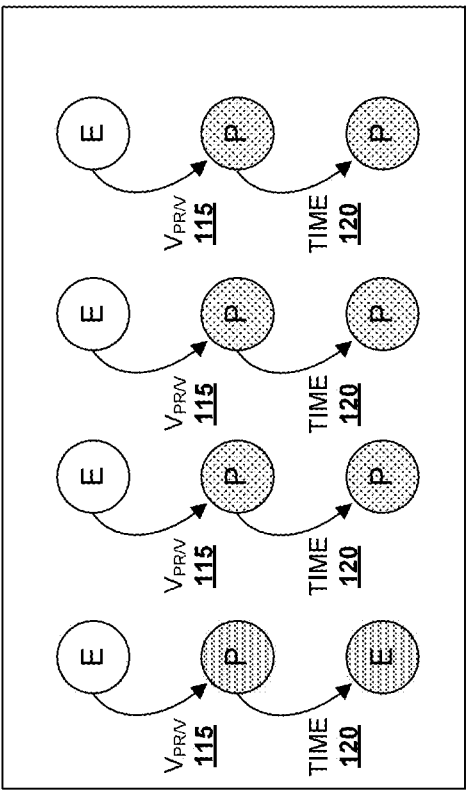
FIG. 1 depicts a diagram of example memory operations according to one or more disclosed embodiments.
Figure 1:
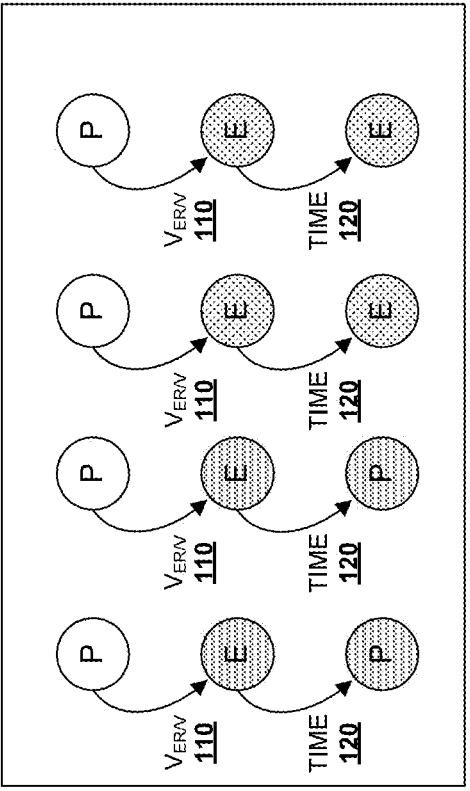
Figure 1:
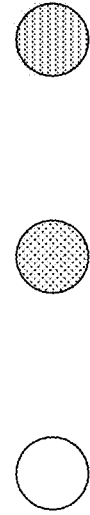

As the name implies, two-terminal memory device has two terminals or electrodes. Herein, the terms "electrode" and "terminal" are used interchangeably. Situated between the TE and BE of a two-terminal memory device is typically an interface layer sometimes referred to as a switching layer, a resistive switching medium (RSM) or a resistive switching layer (RSL). When incorporating a RSM, the two-terminal memory device can be referred to as a (two-terminal) resistive switching device.

Composition of memory cells, generally speaking, can vary per device with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, Si3N4, SiNx, etc.), a Si sub-oxide (e.g., SiOx wherein x has a value between 0.1 and 2), a Si sub-nitride, a metal oxide, a metal nitride, a non-stoichiometric silicon compound, and so forth. Other examples of materials suitable for the RSL could include SixGeyOz (where x, y and z are respective suitable positive numbers), a silicon oxide (e.g., SiON, where N is a suitable positive number), a silicon oxynitride, an undoped amorphous Si (a-Si), amorphous SiGe (a-SiGe), TaOB (where B is a suitable positive number), HfOC (where C is a suitable positive number), TiOD (where D is a suitable number), Al2OE (where E is a suitable positive number) and so forth, a nitride (e.g. AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number 0<x<2, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: $TiN_x$, $TaN_x$, $AlN_x$, $CuN_x$, $WN_x$ and $AgN_x$, where x is a positive number. In a further embodiment(s), the active metal layer can comprise a metal oxide selected from the group consisting of: $TiO_x$, $TaO_x$, $AlO_x$, $CuO_x$, $WO_x$ and $AgO_x$. In yet another embodiment(s), the active metal layer can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: $MN_x$, e.g., $AgN_x$, $TiN_x$, $AlN_x$, etc., and the resistive switching layer comprises a metal nitride: $MN_y$, e.g., $AgO_y$, $TiO_y$, $AlO_y$, and so forth, where y and x are positive numbers, and in some cases y is larger than x. In an alternative embodiment of this example, the particle donor layer comprises a metal oxide: $MO_x$, e.g., $AgO_x$, $TiO_x$, $AlO_x$, and so on, and the resistive switching layer comprises a metal oxide: $MO_y$, e.g., $AgO_y$, $TiO_y$, $AlO_y$, or the like, where y and x are positive numbers, and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where x and y are typically non-stoichiometric values, or vice versa in a still further embodiment. As utilized herein, variables x, a, b, and so forth representative of values or ratios of one element with respect to another (or others) in a compound can have different values suitable for respective compounds, and are not intended to denote a same or similar value or ratio among the compounds.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

Overview

For memory devices having switching characteristics based upon the presence or absence of a conductive filament(s) therein to change the resistance of the memory device between a low resistance state (filament present) and a high resistance state (filament disrupted), the inventors of the subject matter disclosed herein have discovered specific retention problems (short-term memory erase failures) in embodiments of memory devices. Such failures involve erasing a memory (e.g. from a low resistance state to a high resistance state) typically with a negative voltage, and after an amount of time, having the memory by itself return to a programmed state (e.g. from a high resistance state to a low resistance state).

After investigating the novel problem, although the subject disclosure is not limited by any theory, the inventors postulate that although a filament of a programmed memory cell may be immediately disrupted during an erase cycle, the physical movement of the conductive particles of the filament is not permanent. More specifically, the disrupted conductive particles may relax and reform the conductive filament, an amount of time after the erase cycle. The amount of time may be short (corresponding to short-term memory problems) for some memory devices and long (corresponding to long-term memory endurance problems) for other memory devices on the same memory structure.

Embodiments disclosed herein present a modified erase process wherein after an initial erase cycle on one or more memory devices (typically with a negative voltage or first polarity voltage), a weak programming cycle is applied (typically with a positive voltage or a second polarity voltage). It is believed that the weak programming cycle causes or facilitates memory devices that have short-term or long-term memory erase tendencies to program (e.g. to re-enter the low resistance state). In some embodiments, after applying the erase voltage (typically negative) and erase current, instead of returning to zero bias immediately, the weak program voltage (typically positive) may be applied, followed by returning to zero bias. In other words, the weak programming pulse may be considered part of the erase process in some embodiments, or can be a separate operation from an erase process in other embodiments.

In various embodiments, the weak programming signal may be smaller than a normal program signal (e.g. 25% to 75% program voltage, program current, program duration, or the like). In some embodiments, the weak program signal may be about the same or greater magnitude as a regular program, but the duration may be significantly shorter, e.g. a voltage impulse or pulse with very short duration.

In some embodiments, the one or more memory devices that are subject to the modified erase cycle (e.g., erase process followed by weak program process) are then read back to determine the resistance state of the devices. Memory devices that return a low resistance state (because the modified erase cycle facilitates the short term erase failure) are identified in response to the read cycle. These devices can then be subject to additional modified erase cycles, marked as defective, or the like. In various embodiments, additional modified erase cycles may have the same characteristics as a previous modified erase cycle(s) (e.g., with default or preset voltage magnitude, erase current, cycle duration, number of cycles, etc.), or can involve different (e.g., higher or lower) erase voltage magnitudes, different (e.g., higher or lower) erase currents, different (e.g., longer or shorter) erase cycles, repeated erase cycles, or the like. In some cases, if after multiple weak program cycles as described above, the memory cell cannot maintain an erase state, the memory cell may be marked as faulty and removed from a memory table, or the like.

The inventors of the disclosed subject matter have verified that memory devices subject to weak erase embodiments presented herein provide greater endurance or longevity by having: lower "on" (programmed) currents compared to memory devices without the disclosed embodiments, and a tighter (narrower) current distribution for "on" and "off.

In other embodiments of the present disclosure, the concepts may be applied to weakly programmed devices. More specifically, after subjecting a memory device to a program voltage, the memory device may initially be in a low resistance or programmed state. However, if the memory device is weakly programmed, the memory device may degrade with time, and become unprogrammed or erased. The amount of elapsed time until the memory cell loses its programmed state may vary from minutes to days, or the like. Accordingly, in some embodiments, after programming a memory cell, and confirming with a read operation, the memory cell may be programmed. Next, a weak erase signal is applied to the programmed memory cell. In various embodiments, the weak erase signal may be smaller than the normal erase signal (e.g. 25% to 75% erase voltage, erase current, erase duration, or the like). In some embodiments, the weak erase signal may be about the same or greater magnitude as a regular erase, but the duration may be significantly shorter, e.g. a voltage impulse or pulse with very short duration. If the memory cell is weakly programmed, the memory cell will become erased in response to the weak erase signal. If the memory cell is normally programmed, it will remain programmed in response to the weak erase signal. A read signal is then applied to the memory cell to identify if it has erased or not. In the situation where the memory cell was weakly programmed and erased due to the weak erase signal, the memory cell will be reprogrammed. In some cases, the subsequent reprogramming signals may be the same as the original program signals, whereas in other cases the reprogramming signals may have a higher programming voltage, a higher programming current, a longer programming duration, and the like. Subsequently, a weak erase signal may be applied to the reprogrammed memory cell, and the process described above may be repeated. In some cases, if, after multiple weak erase cycles, the memory cell cannot maintain a program state, the memory cell may be marked as faulty and removed from a memory table, or the like.

Referring now to the drawings, FIG. 1 illustrates a diagram of memory operations 100 illustrating one or more embodiments of the present disclosure. Particularly, there is depicted an example erase and verify process 102, and an example program and verify process 104.

Erase and verify process 102 illustrates a number of programmed memory cells (circles with the letter "P" within them) in an initial programmed state (no shading of the circle). An erase and verify process 110 is applied to each of these memory cells, including an erase process to erase the cells from the programmed state to an erase state, and a read process to verify that each cell is indeed erased. Following the erase and verify process 110, each cell is changed to erased memory cells (circles with the letter "E" within them). While some memory cells are strongly erased (dotted shading of the circle), and will retain their erased state over time, some are only marginally erased (shaded horizontal lines) and will return to their previous program state (e.g., spontaneously) with the passage of time 120. However, both strongly erased and marginally erased memory cells will respond to the read verification process as erased.

Similarly, program and erase process 104 illustrates a number of erased memory cells in an initial erased state. A program and verify process 115 is applied to each of these memory cells, including a program process to program the cells from the erased state to the programmed state, as illustrated, and a read process to verify that each cell is indeed programmed. Following the program and verify process 115, each cell is changed to programmed memory cells. As shown by the horizontal shading, one of the memory cells is only weakly programmed (e.g., subject to spontaneous erasure after time 120). Thus, after time 120, the weakly programmed memory cell becomes erased, whereas the remaining memory cells remain programmed.

Figure 2:
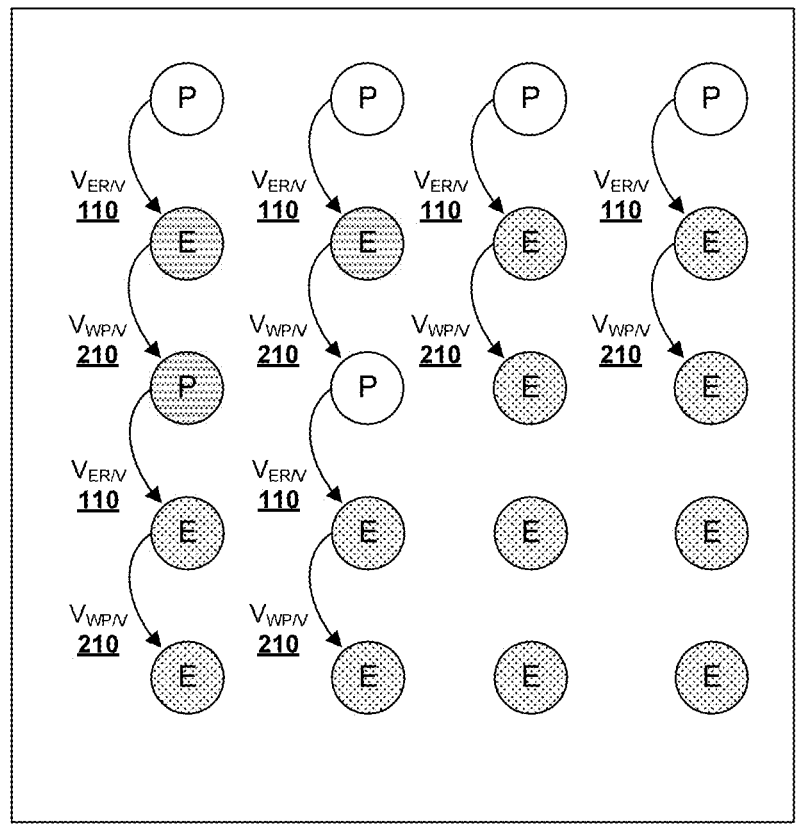
FIG. 2 illustrates a diagram of a sample erase process incorporating a weak program process, in some embodiments.
Figure 2:
Figure 2:
Figure 2:

Referring now to FIG. 2, a weak program and verify process 200 is illustrated to address problems with marginally erased memory cells. Several memory cells initially in the program state are subject to an erase and verify process 110. Each memory cell is switched to the erased state, and verified through a read process to be erased, though two of the memory cells are marginally erased.

Following the erase and verify process 200, a weak program and verify process 210 is performed on each of the two-terminal memory cells. In response to the weak program and verify process 210, the marginally erased cells become programmed, while the normally erased memory cells remain erased. The verify (e.g., read process) identifies which of these memory cells are programmed, and a second erase and verify process 110 is performed on this portion of the two-terminal memory cells. A second weak program and verify process 210 is performed on the portion of the two-terminal memory cells. As illustrated, the memory cells remain erased as identified by the verify (read process).

Figure 3:
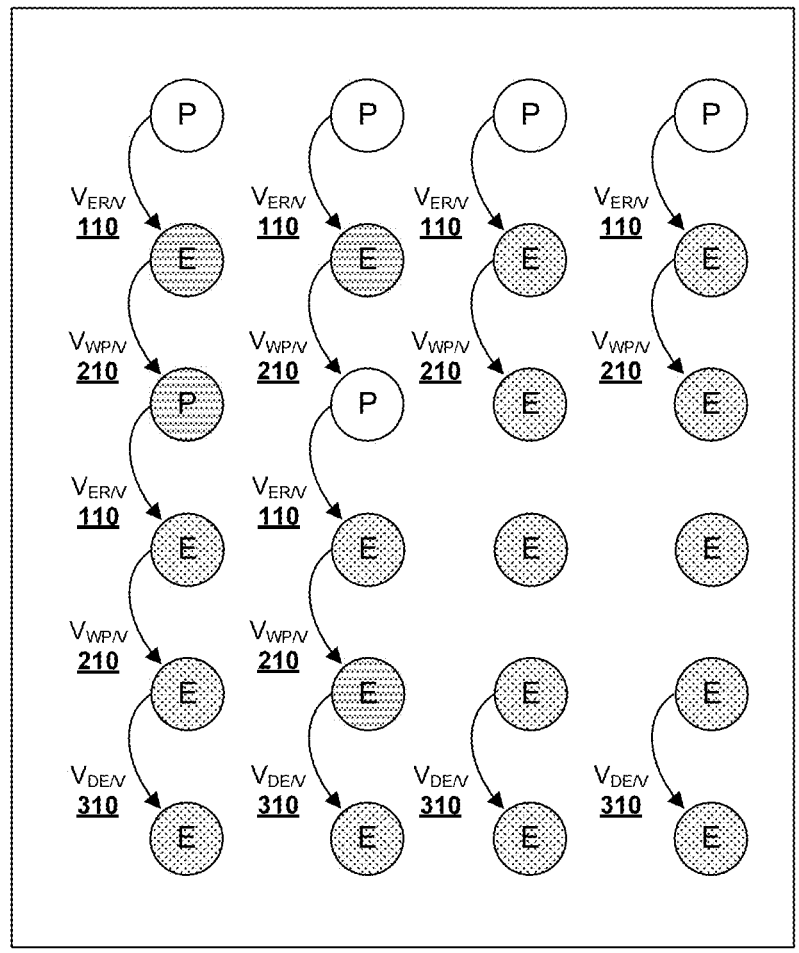
FIG. 3 depicts a diagram of an example erase process incorporating a weak program process and a dummy erase process, in still other embodiments.
Figure 3:
Figure 3:
Figure 3:

FIG. 3 illustrates a weak program and verify with a dummy erase and verify process 300 according to alternative or additional embodiments of the present disclosure. Several programmed memory cells are erased with an erase and verify process 110, resulting in two marginally erased cells and two normally (e.g., strongly, etc.) erased cells. Thereafter, a weak program and verify process 210 is applied to each of the several memory cells to cause the marginally erased cells to change resistance state. As indicated, two of the memory cells become programmed following the weak program.

After verifying two memory cells are programmed, a second erase and verify process 110 is implemented on the two memory cells. In addition, a second weak program and verify process 210 is implemented on the two memory cells. In the event that the second weak program and verify process 210 causes a normally erased memory cell to become marginally erased, a dummy erase and verify 310 is performed on the plurality of memory cells. The dummy erase and verify 310 results in the plurality of memory cells being normal erased cells.

Figure 4:
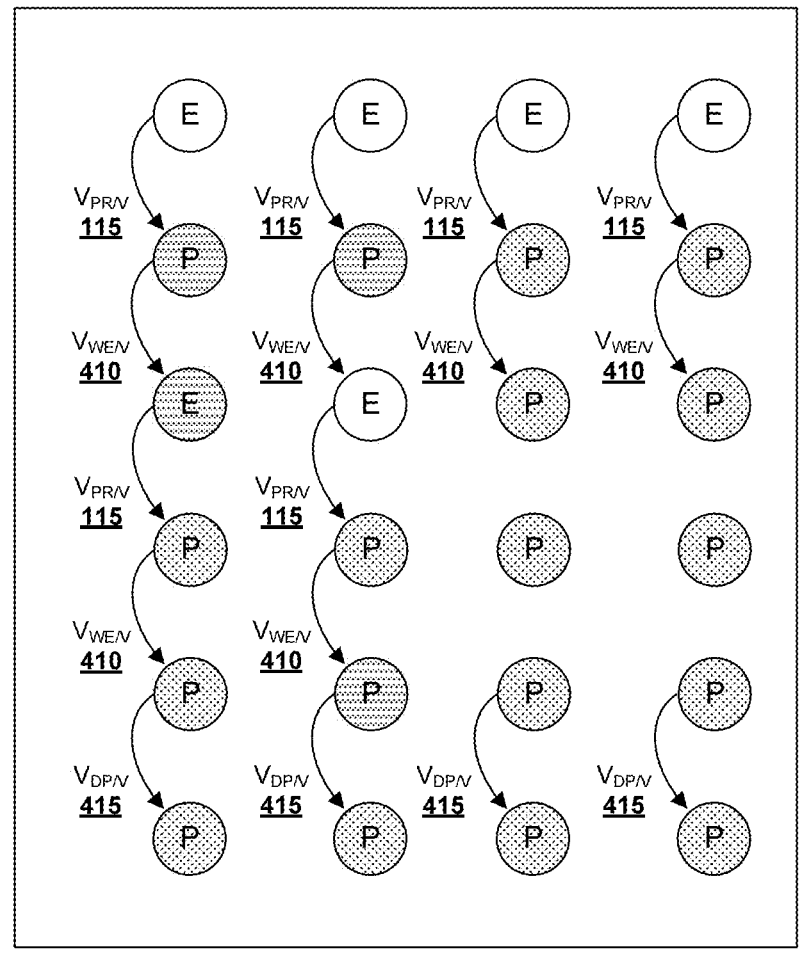
FIG. 4 illustrates a diagram of a sample program process incorporating a weak erase process and a dummy program process, in an embodiment(s)
Figure 4:
Figure 4:

FIG. 4 illustrates a weak erase and verify with dummy program and verify 400 according to still further embodiments of the present disclosure. Initially, four erased memory cells are programmed with a program and verify process 115. Each of the memory cells is verified to be programmed. To test the programming, a weak erase and verify process 410 is applied to the four memory cells, which identifies two of the memory cells as becoming erased.

A second program and verify process 115 is applied to the two identified erased memory cells, causing them to become programmed. A second weak erase and verify process 410 is then implemented on the two memory cells. In the event that the second weak erase and verify process 410 causes a normally programmed memory cell to become marginally programmed, a dummy program and verify 415 is performed on the plurality of memory cells. The dummy program and verify 415 results in the plurality of memory cells being normal programmed cells.

Figure 5:
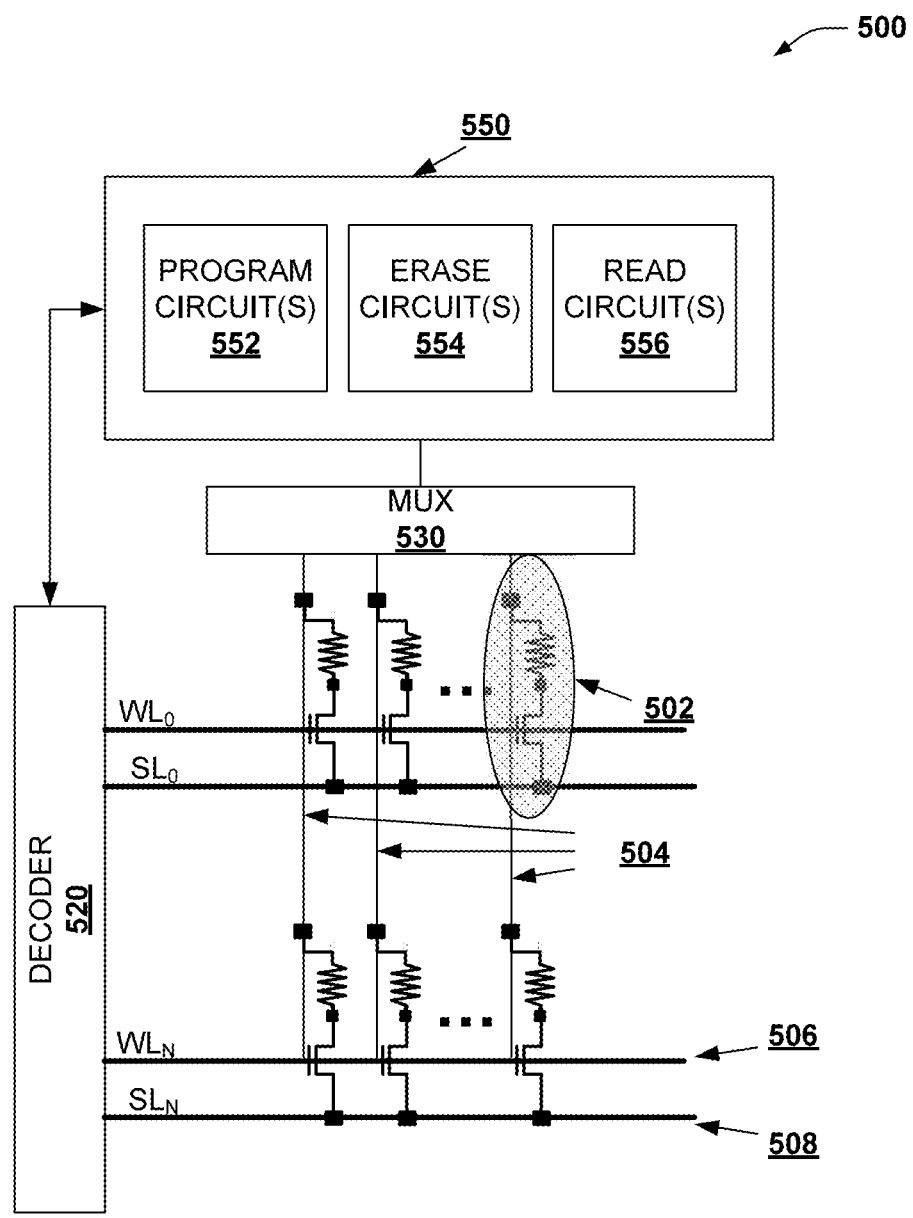
FIG. 5 depicts a block diagram of an example electronic architecture for memory operations on two-terminal memory according to disclosed embodiments.

FIG. 5 illustrates a block diagram of a sample electronic architecture 500 for performing memory operations on two-terminal memory cells, as described herein. Electronic architecture 500 can comprise an array of two-terminal memory cells 502, connected at respective first ends thereof to one of a set of bitlines 504, and connected at respective second ends thereof to one of a set of sourcelines 508. For memory cells in a one transistor—one resistive cell configuration (1T1R), access to rows of memory cells can be facilitated by respective wordlines 506.

Operation circuitry 550 accesses respective bitlines 504 utilizing a multiplexer 530, and respective sourcelines 508 (and wordlines 506) via a decoder 520. To facilitate the memory operations disclosed herein, operation circuitry can comprise a program circuit(s) 552, an erase circuit(s) 554 and a read circuit(s) 556.

Program circuit(s) 552 can be configured to apply a program process having default characteristics, including voltage, current, pulse duration or number of pulses (in the program process), or a suitable combination of the foregoing. Further, program circuit(s) 552 can be configured to apply a weak program process having at least one different characteristic from the default characteristics. The different characteristic(s) can comprise a different voltage, current, pulse duration or number of pulses, or a combination of the foregoing. It should be appreciated that in general the weak program process will have a reduced voltage magnitude (e.g., about 25% to about 75% reduced voltage magnitude, or suitable value there between), reduced current, reduced pulse duration or reduced number of pulses, but in at least some embodiments the weak program process can have at least one of these characteristics increased, with one or more others are reduced.

Erase circuit(s) 554 can be configured to apply an erase process having default characteristics, including voltage, current, pulse duration or number of pulses (in the erase process), or a suitable combination of the foregoing. For bipolar two-terminal memory cells 502, the erase process will generally have voltage of opposite polarity from the program process, but can have different magnitudes of the above characteristics as well. In addition to the foregoing, erase circuit(s) 554 can be configured to apply a weak erase process having at least one different characteristic from the default characteristics of the erase process. The different characteristic(s) can comprise a different voltage, current, pulse duration or number of pulses, or a combination of the foregoing. It should be appreciated that in general the weak erase process will have a reduced voltage magnitude (e.g., about 25% to about 75% reduced voltage, or suitable value there between), reduced current, reduced pulse duration or reduced number of pulses, but in at least some embodiments the weak erase process can have at least one of these characteristics increased, with one or more others are reduced (e.g., decreased voltage, decreased current with increased pulse duration and same number of pulses, or other suitable combination).

Read circuit(s) 556 can provide a read pulse configured to maintain a current state of two-terminal memory cell 502, while determining a current resistance state thereof. The read pulse is typically smaller in magnitude than a program or erase pulse. In various embodiments, read pulses can be implemented by read circuit(s) 556 following a program pulse (or weak program pulse) implemented by program circuit(s) 552, or following an erase pulse (or weak erase pulse) implemented by erase circuit(s) 554.

The diagrams included herein are described with respect to interaction between several memory cells, memory cell components, memory arrays or memory architectures. It should be appreciated that such diagrams can include those memory cells, components, arrays and architectures specified therein, some of the specified memory cells/components/arrays/architectures, or suitable alternative or additional memory cells/components/arrays/architectures. Sub-components can also be implemented as electrically connected to other sub-components rather than included within a parent architecture. Likewise, individual components can be implemented in a combined architecture according to other embodiments. For instance, program circuitry, erase circuitry and read circuitry 552, 554, 556 can be implemented as a single set of circuitry, in an embodiment. Moreover, some of the disclosed embodiments can be implemented as part(s) of other disclosed embodiments where suitable.

Still further, one or more disclosed processes can be combined into a single process providing aggregate functionality. For instance, a program or erase process can comprise a read/verify process, or vice versa, to facilitate programming/erasing a semiconductor cell and verifying completion of the programming/erasing by way of a single process. In addition, it should be appreciated that respective rows of multiple cell memory architectures can be erased in groups (e.g., multiple rows erased concurrently) or individually. Moreover, it should be appreciated that multiple memory cells on a particular row can be read or programmed in groups (e.g., multiple memory cells read/programmed concurrently) or individually. Components of the disclosed architectures can also interact with one or more other components not specifically described herein but known by those of skill in the art or made evident by way of the context provided herein.

In view of the exemplary diagrams described herein, process methods that can be implemented in accordance with the disclosed subject matter will be better appreciated with reference to the flow charts of FIGS. 6-10. While for purposes of simplicity of explanation, the methods of FIGS. 6-10 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional method steps not depicted but known to one skill in the art or made known by way of the context provided herein, can be incorporated into the described methods. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 6:
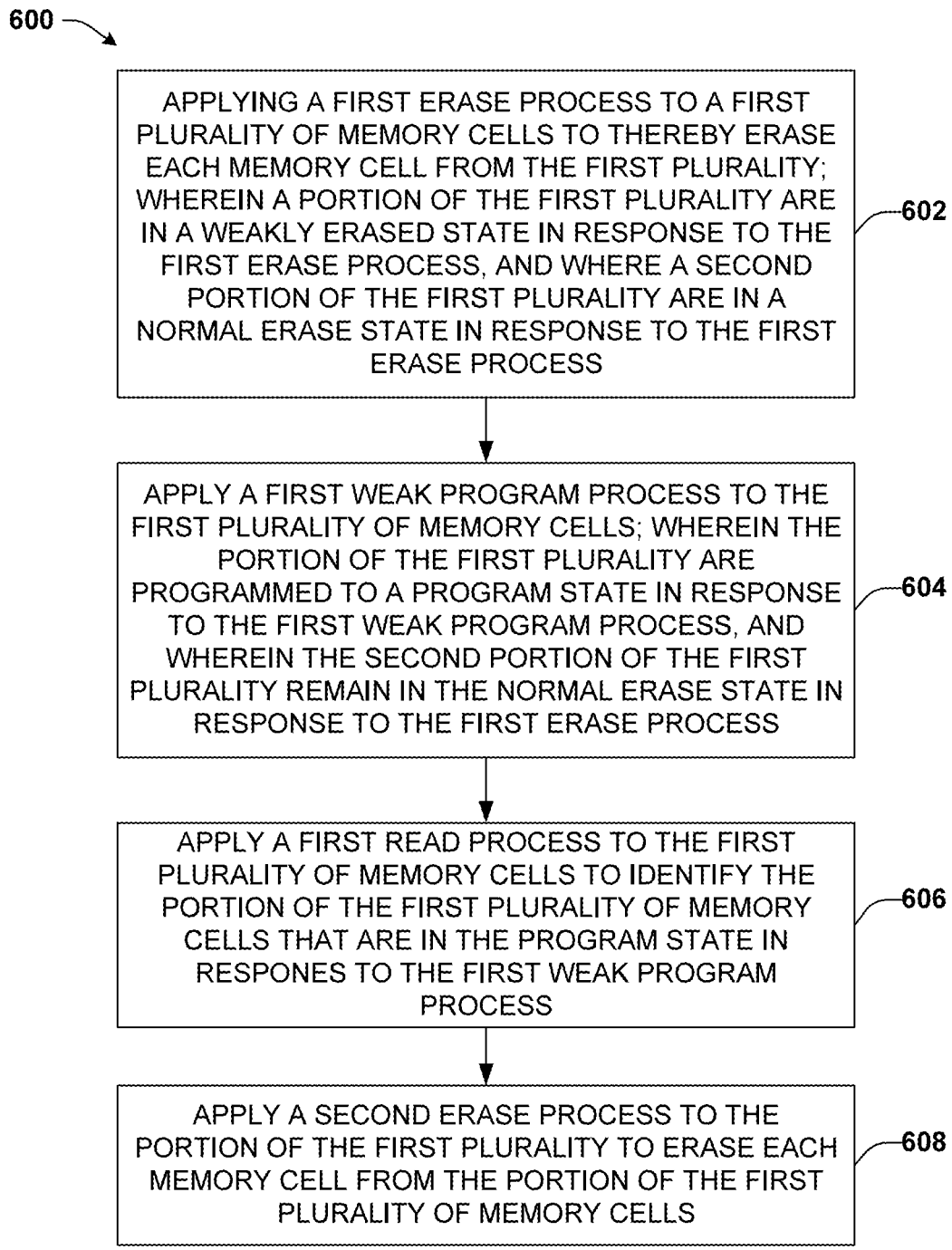
FIG. 6 depicts a flowchart of a sample method for erasing two-terminal memory cells incorporating a weak program process, in an embodiment(s)

FIG. 6 depicts a flowchart of an example method for implementing an erase process according to one or more disclosed embodiments. At 602, method 600 can comprise applying a first erase process to a first plurality of memory cells to thereby erase each memory cell from the first plurality of memory cells. In various embodiments, a second plurality of memory cells from the first plurality of memory cells (e.g., a first subset of the plurality) are in a weakly erased state in response to the first erase process, and a third plurality of memory cells from the first plurality of memory cells (e.g., a second subset of the plurality) are in a normally erased state in response to the first erase process.

At 604, method 600 can comprise, following the first erase process, applying a first weak programming process to the first plurality of memory cells that have been erased in response to the first erase process. Following the first weak programming process, memory cells from the second plurality of memory cells are programmed to a programmed state, and memory cells from the third plurality of memory cells remain in the normally erased state.

At 606, method 600 can comprise applying a first read process to the first plurality of memory cells to identify the second plurality of memory cells from the first plurality of memory cells that are in the programmed state in response to the first weak programming process. Moreover, at 608, method 600 can comprise applying a second erase process to the second plurality of memory cells to thereby erase each memory cell from the second plurality of memory cells.

In some embodiments, a portion of the memory cells from the second plurality are in the weakly erased state in response to the second erase process, and a second portion of memory cells from the second plurality are in the normally erased state in response to the second erase process. To address these circumstances, method 600 can further comprise applying a second weak programming process to the second plurality of memory cells that have been erased. The second weak programming process can cause memory cells from the third plurality of memory cells to be programmed to the programmed state, and can cause memory cells from the fourth plurality of memory cells to remain in the normally erased state. Following the second weak programming process, method 600 can further comprise applying a second read process to the second plurality of memory cells to identify the third plurality of memory cells from the second plurality of memory cells that are in the programmed state in response to the second weak programming process.

In additional embodiments, method 600 can comprise applying a third erase process to the third plurality of memory cells to thereby erase each memory cell from the third plurality of memory cells. In some embodiments, the first weak programming process can be associated with a first voltage magnitude, and a first duration. In further embodiments, the second weak programming process can be associated with a second voltage magnitude, different from the first voltage magnitude, and a second duration. In at least one embodiment, the first voltage magnitude can be within a range of about 25% to about 75% of the second voltage magnitude, or any suitable amount there between (e.g., 30%, 35%, 40%, . . . ). In another embodiment, the first duration can be within a range of about 25% to about 75% of the second voltage duration, or any suitable value there between. In further embodiments, a combination of the foregoing can be utilized. In still other embodiments, a voltage magnitude of the second erase process exceeds a voltage magnitude for the first erase process.

Figure 7:
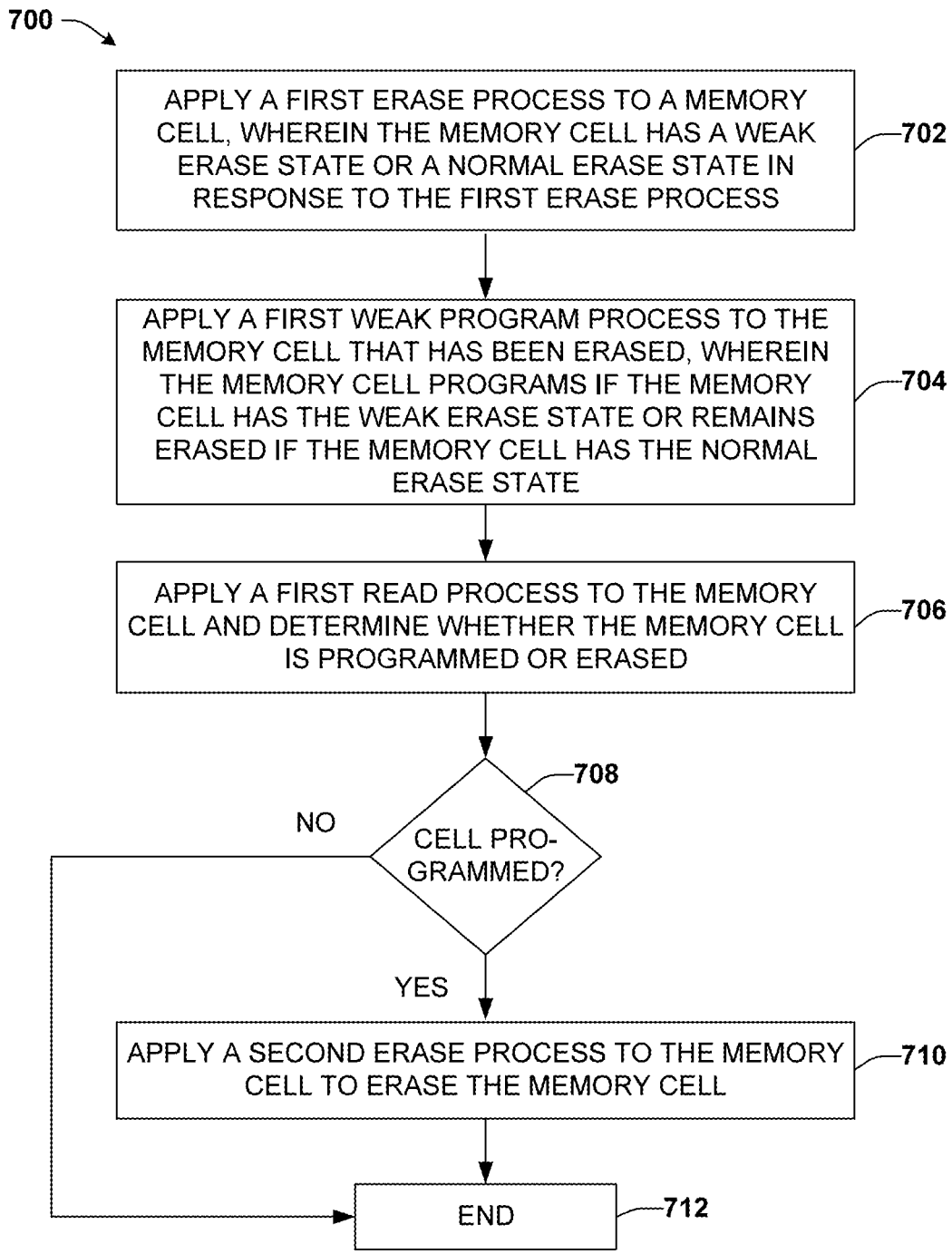
FIG. 7 depicts a flowchart of an example method for erasing two-terminal memory cells according to alternative embodiments of the disclosure.

FIG. 7 depicts a flowchart of a sample method 700 for implementing a memory operation on a two-terminal memory cell, according to alternative or additional embodiments of the present disclosure. At 702, method 700 can comprise applying a first erase process to the memory cell to thereby erase the memory cell. In response to the first erase process, the memory cell has a weakly erased state or a normally erased state. At 704, method 700 can comprise applying a first weak programming process to the memory cell that has been erased, wherein the memory cell programs if the memory cell has the weakly erased state, and wherein the memory cell remains erased if the memory cell has the normally erased state.

At 706, method 700 can comprise applying a first read process to the memory cell to determine whether the memory cell is programmed or erased. At 708, in response to the first read process determining that the memory cell is programmed, method 700 can proceed to 710 and further comprise applying a second erase process to the memory cell to thereby erase the memory cell. In response to the first read process determining that the memory cells are erased, or in response to reference number 710, method 700 can end at reference number 712.

According to further embodiments, the memory cell can be in a weakly erased state or a normally erased state in response to the second erase process. Method 700 can further comprise applying a second weak programming process to the memory cell that has been erased. In response to the second weak programming process, the memory cell becomes programmed if in the weakly erased state, or remain erased if in the normally erased state. Method 700 can additionally comprise applying a second read process to the memory cell to determine whether the memory cell is programmed or erased, and can comprise applying a third erase process to the memory cell to thereby erase the memory cell if the memory cell is programmed in response to the second weak programming process.

In still further embodiments, the first weak programming process can be associated with a first voltage magnitude, and a first duration, and the second weak programming process can be associated with a second voltage magnitude and a second duration. The second voltage magnitude can be higher than the first voltage magnitude, in one or more embodiments.

In an alternative or additional embodiment, the first voltage magnitude can be within a range of about 25% to about 75% of the second voltage magnitude, or any suitable value there between. In another embodiment, the first duration can be within a range of about 25% to about 75% of the second voltage duration, or a suitable value there between.

Figure 8:
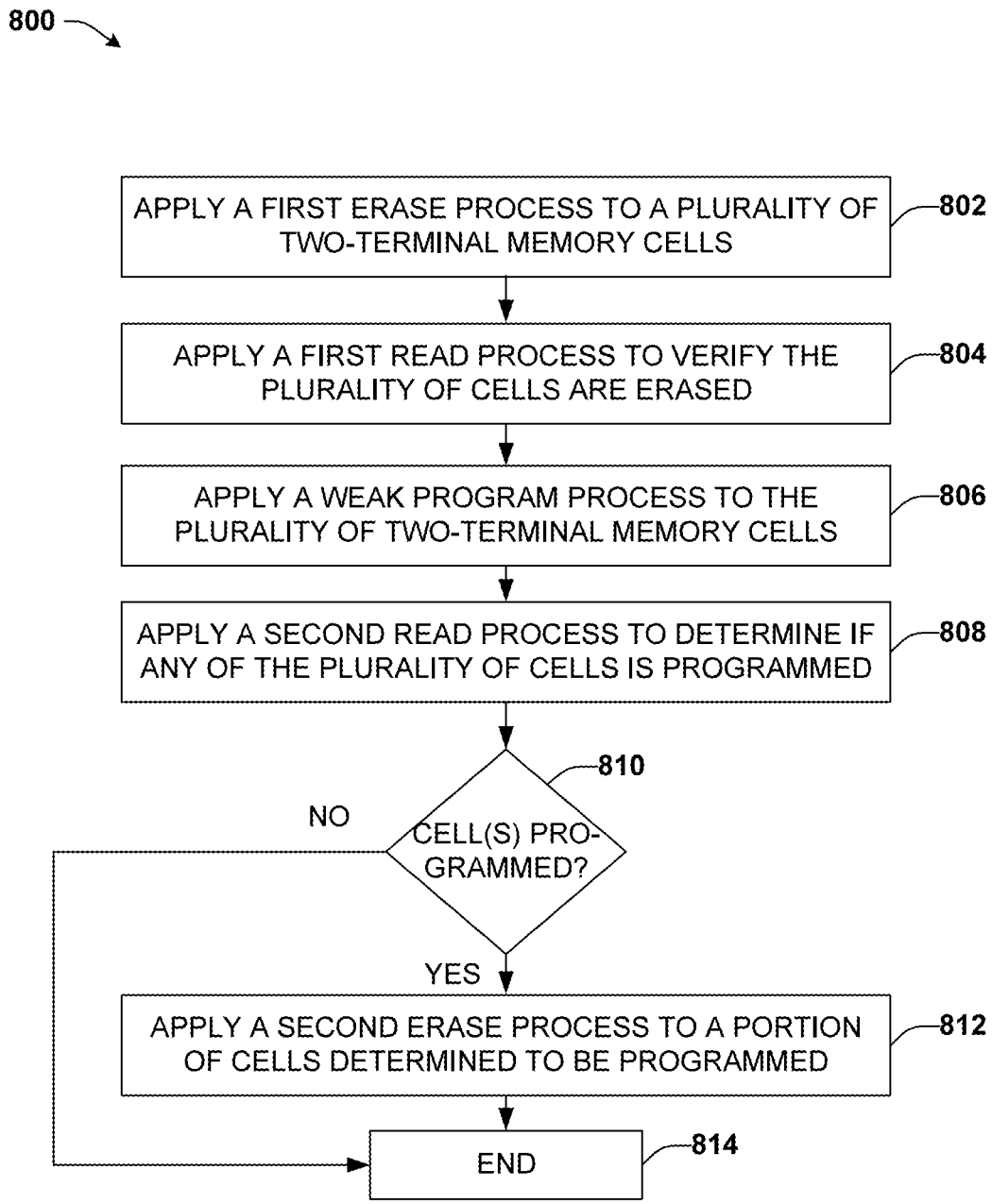
FIG. 8 illustrates a flowchart of a sample method for erasing memory cells including a weak program process, in further embodiments.

FIG. 8 illustrates a flowchart of a sample method 800 for erasing two-terminal memory cells of a memory array, in one or more embodiments. At 802, method 800 can comprise applying a first erase process to a plurality of two-terminal memory cells. At 804, method 800 can comprise applying a first read process to verify the plurality of two-terminal memory cells are erased. Additionally, at 806, method 800 can comprise applying a weak program process to the plurality of two-terminal memory cells, and at 808, method 800 can comprise applying a second read process to determine if any of the plurality of two-terminal memory cells is programmed.

At 810, a determination is made as to whether any of the two-terminal memory cells is programmed in response to the weak program process. If one or more cells are programmed, method 800 proceeds to 812 and further comprises applying a second erase process to the portion of the two-terminal memory cells determined to be programmed in response to the second read process. If no cells are determined to be programmed, or following reference number 812, method 800 can end at 814.

Figure 9:
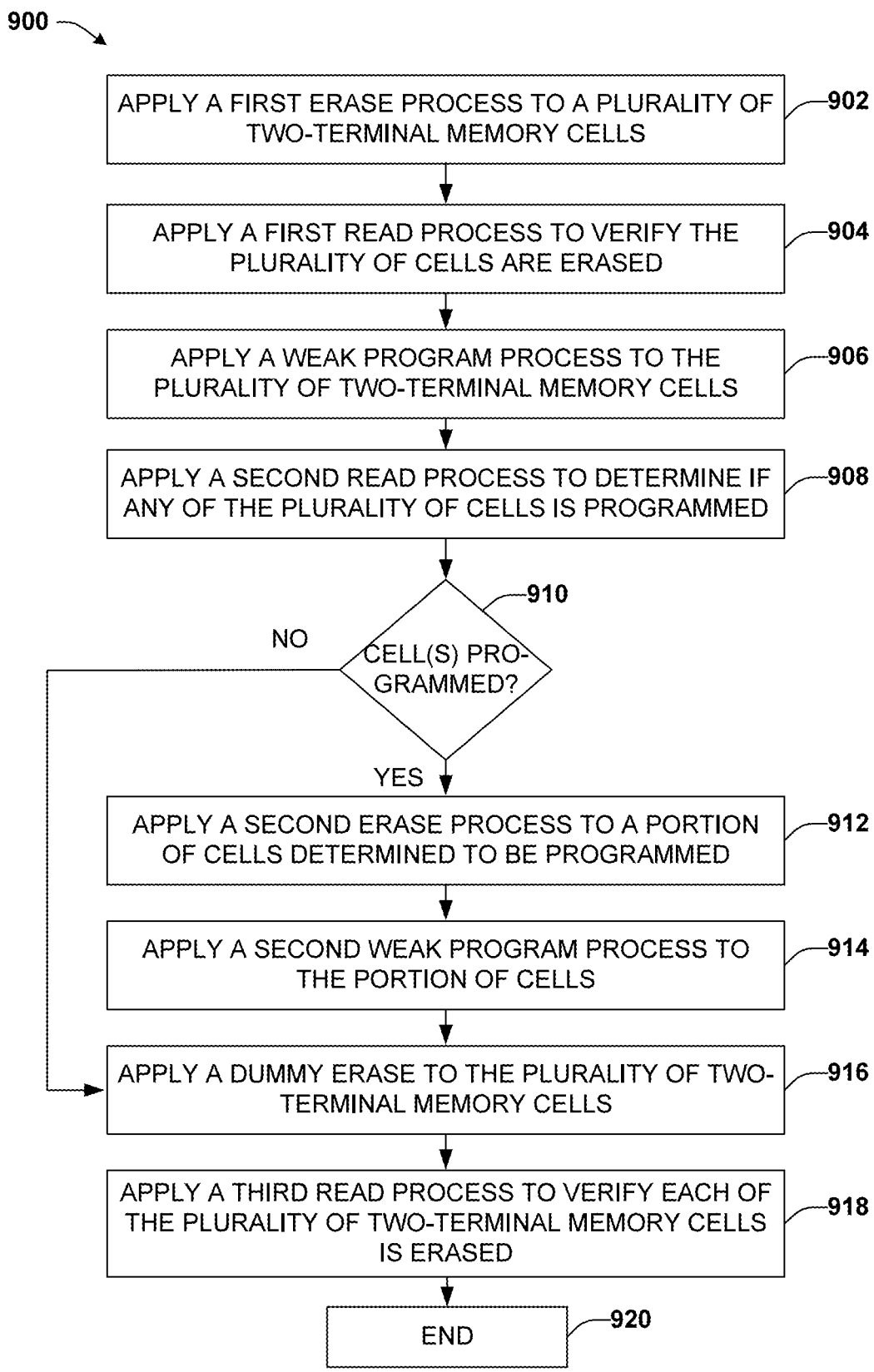
FIG. 9 depicts a flowchart of an example method for erasing two-terminal memory utilizing a weak program process(es) and dummy erase process(es)

FIG. 9 depicts a flowchart of a sample method 900 for erasing two-terminal memory cells according to still further embodiments of the present disclosure. At 902, method 900 can comprise applying a first erase process to a plurality of two-terminal memory cells. At 904, method 900 can comprise applying a first read process to verify the plurality of cells are erased. Additionally, at 906, method 900 can comprise applying a weak program process to the plurality of the two-terminal memory cells, and at 908, applying a second read process to determine if any of the plurality of cells is programmed.

At 910, a determination is made as to whether any of the two-terminal memory cells is programmed in response to the weak program process. If a two-terminal memory cell(s) is determined to be programmed, method 900 can proceed to 912. Otherwise, method 900 proceeds to 916.

At 912, method 900 can comprise applying a second erase process to a portion of cells determined to be programmed. At 914, method 900 can comprise applying a second weak program process to the portion of two-terminal memory cells. At 916, method 900 can comprise applying a dummy erase process to the plurality of two-terminal memory cells and, at 918, method 900 can comprise applying a third read process to verify each of the plurality of two-terminal memory cells is erased. At 920, method 900 can end.

Figure 10:
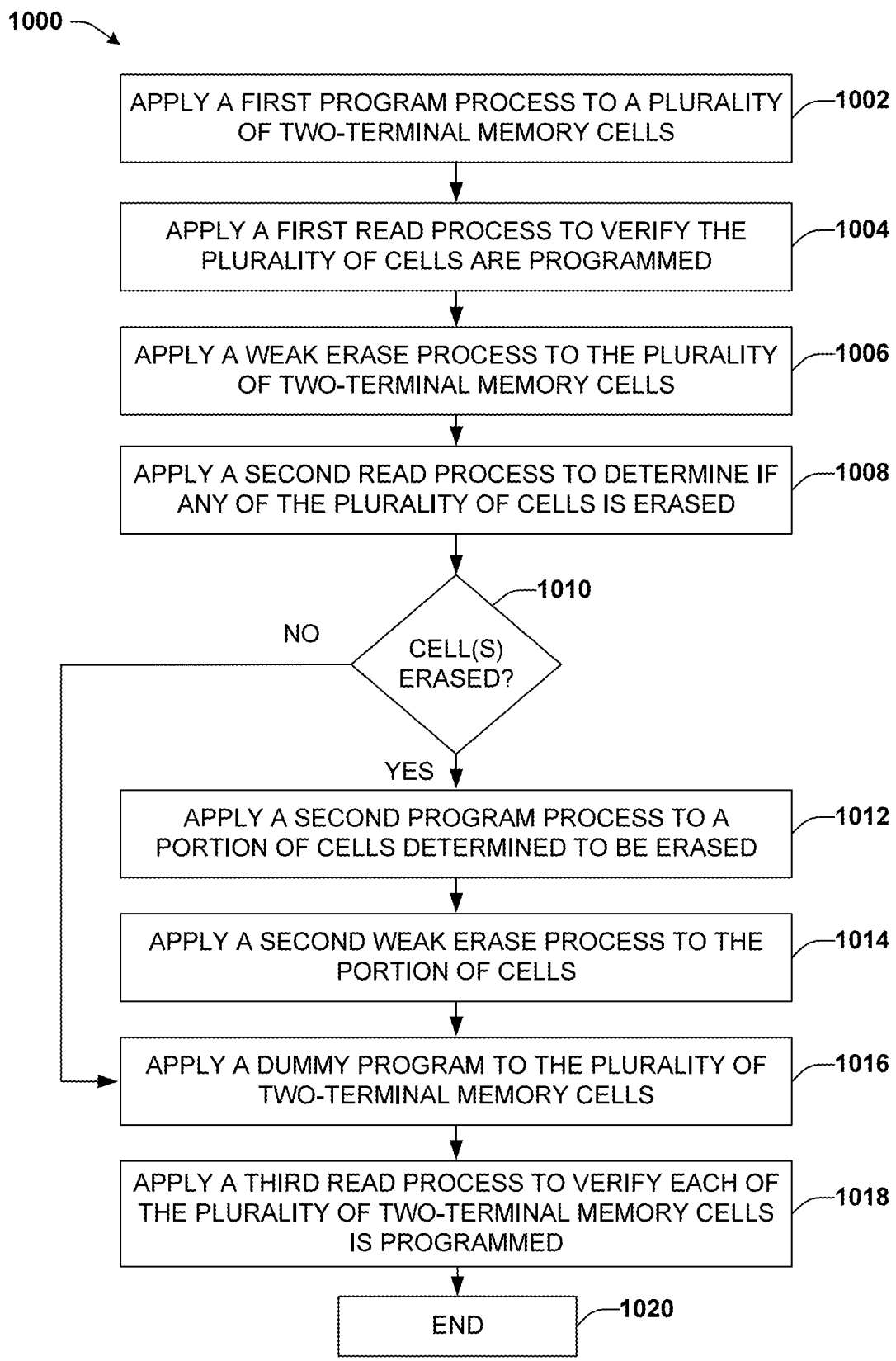
FIG. 10 depicts a flowchart of a sample method for programming two-terminal memory utilizing a weak erase process(es) and dummy program process(es)

FIG. 10 depicts a flowchart of a sample method 1000 for programming two-terminal memory cells according to still further embodiments of the subject disclosure. At 1002, method 1000 can comprise applying a first program process to a plurality of two-terminal memory cells. At 1004, method 1000 can comprise applying a first read process to verify that each of the plurality of cells is programmed. At 1006, method 1000 can comprise applying a weak erase process to the plurality of two-terminal memory cells and, at 1008, method 1000 can comprise applying a second read process to determine if any of the plurality of two-terminal memory cells is erased.

At 1010, method 1000 can determine whether any of the two-terminal memory cells is erased in response to the second read process. If one or more two-terminal memory cells are detected to be erased, method 1000 can proceed to 1012. If no two-terminal memory cells are detected as erased in response to the second read process, method 1000 can proceed to 1016.

At 1012, method 1000 can comprise applying a second program process to a portion of the two-terminal memory cells determined to be erased. At 1014, method 1000 can comprise applying a second weak erase process to the portion of the two-terminal memory cells.

In further embodiments, method 1000 can comprise, at 1016, applying a dummy program process to the plurality of two-terminal memory cells. At 1018, method 1000 can comprise applying a third read process to verify that each of the plurality of two-terminal memory cells is programmed. At 1020, method 1000 can end.

Example Operating Environments

Figure 11:
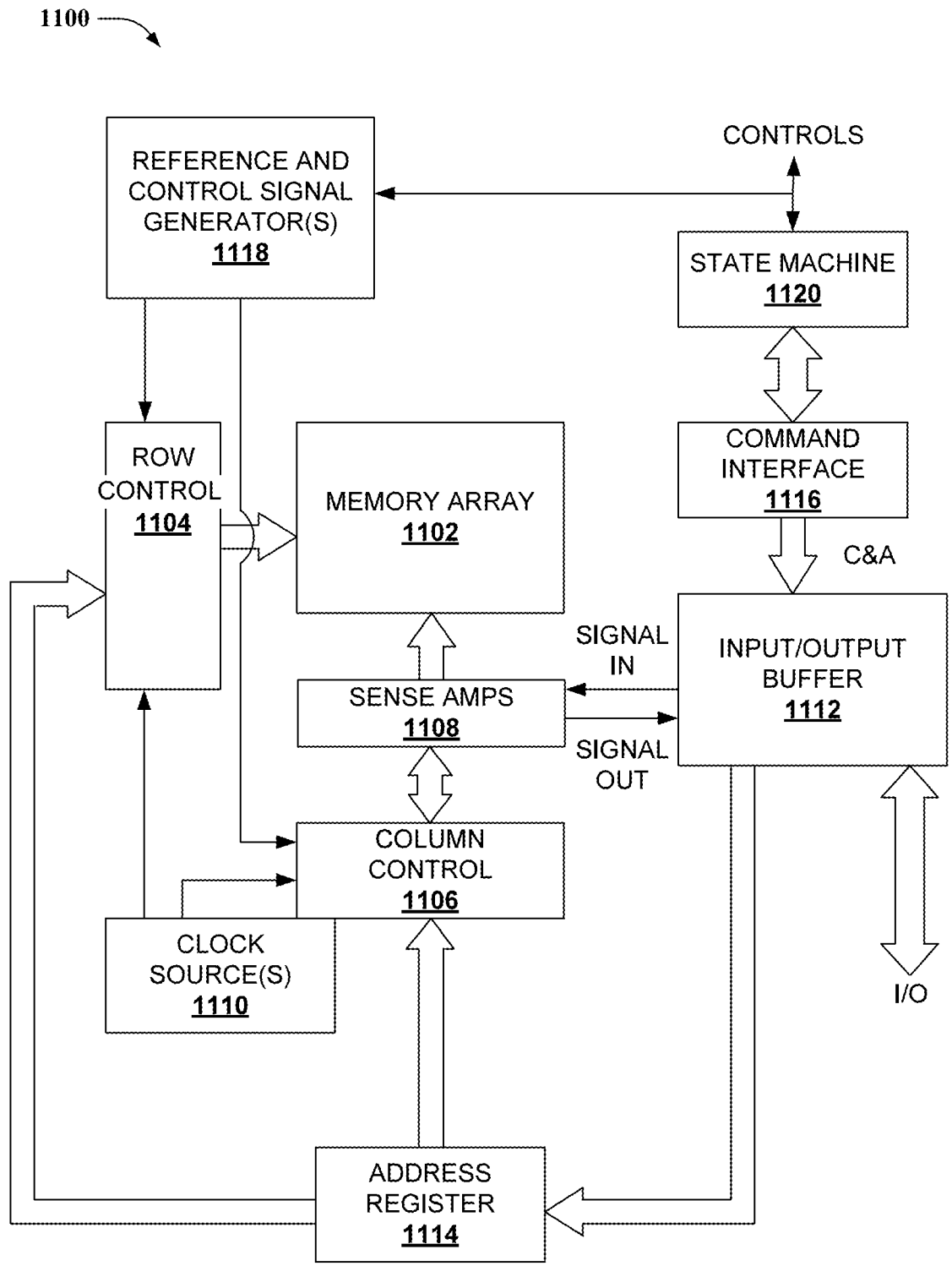
FIG. 11 illustrates a block diagram of a sample electronic operating environment in accordance with certain embodiments presented herein.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of memory architectures and process methodologies for performing memory operations on two-terminal memory devices, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 11 illustrates a block diagram of an example operating and control environment 1100 for a memory array 1102 of a multi-block memory cell array according to aspects of the subject disclosure. In at least one aspect of the subject disclosure, memory array 1102 can comprise memory selected from a variety of memory cell technologies. In at least one embodiment, memory array 1102 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory array 1102 can be configured to operate according to two-terminal memory program or erase operations as provided herein.

A column controller 1106 and sense amps 1108 can be formed adjacent to memory array 1102. Moreover, column controller 1106 can be configured to activate (or identify for activation) a subset of bitlines of memory array 1102. Column controller 1106 can utilize a control signal provided by a reference and control signal generator(s) 1118 to activate, as well as operate upon, respective ones of the subset of bitlines, applying suitable program, erase or read voltages to those bitlines. Non-activated bitlines can be kept at an inhibit voltage (also applied by reference and control signal generator(s) 1118), to mitigate or avoid bit-disturb effects on these non-activated bitlines.

In addition, operating and control environment 1100 can comprise a row controller 1104. Row controller 1104 can be formed adjacent to and electrically connected with word lines (and sourcelines, in some embodiments) of memory array 1102. Further, utilizing control signals of reference and control signal generator(s) 1118, row controller 1104 can select particular rows of memory cells with a suitable selection voltage. Moreover, row controller 1104 can facilitate program, erase or read operations by applying suitable voltages at selected word lines (and sourcelines). Similar to column controller 1106, row controller 1104 can apply an inhibit voltage to non-activated wordlines (sourcelines) to mitigate or avoid bit-disturb effects on the non-activated wordlines (sourcelines).

Sense amps 1108 can read data from, or write data to the activated memory cells of memory array 1102, which are selected by column control 1106 and row control 1104. Data read out from memory array 1102 can be provided to an input and input/output buffer 1112. Likewise, data to be written to memory array 1102 can be received from the input and input/output buffer 1112 and written to the activated memory cells of memory array 1102.

A clock source(s) 1110 can provide respective clock pulses to facilitate timing for read, write, and program operations of row controller 1104 and column controller 1106. Clock source(s) 1110 can further facilitate selection of wordlines or bitlines in response to external or internal commands received by operating and control environment 1100. Input and input/output buffer 1112 can comprise a command and address input, as well as a bidirectional data input and output. Instructions are provided over the command and address input, and the data to be written to memory array 1102 as well as data read from memory array 1102 is conveyed on the bidirectional data input and output, facilitating connection to an external host apparatus, such as a computer or other processing device (not depicted, but see e.g., computer 1202 of FIG. 12, infra).

Input and input/output buffer 1112 can be configured to receive write data, receive an erase instruction, receive a status or maintenance instruction, output readout data, output status information, and receive address data and command data, as well as address data for respective instructions. Address data can be transferred to row controller 1104 and column controller 1106 by an address register 1110. In addition, input data is transmitted to memory array 1102 via signal input lines between sense amps 1108 and input and input/output buffer 1112, and output data is received from memory array 1102 via signal output lines from sense amps 1108 to input and input/output buffer 1112. Input data can be received from the host apparatus, and output data can be delivered to the host apparatus via the I/O bus.

Commands received from the host apparatus can be provided to a command interface 1116. Command interface 1116 can be configured to receive external control signals from the host apparatus, and determine whether data input to the input and input/output buffer 1112 is write data, a command, or an address. Input commands can be transferred to a state machine 1120.

State machine 1120 can be configured to manage programming and reprogramming of memory array 1102. Instructions provided to state machine 1120 are implemented according to control logic configurations, enabling state machine 1120 to manage read, write, erase, data input, data output, and other functionality associated with memory array 1102. In some aspects, state machine 1120 can send and receive acknowledgments and negative acknowledgments regarding successful receipt or execution of various commands. In further embodiments, state machine 1120 can decode and implement status-related commands, decode and implement configuration commands, and so on.

To implement read, write, erase, input, output, etc., functionality, state machine 1120 can control clock source(s) 1108 or reference and control signal generator(s) 1118. Control of clock source(s) 1108 can cause output pulses configured to facilitate row controller 1104 and column controller 1106 implementing the particular functionality. Output pulses can be transferred to selected bitlines by column controller 1106, for instance, or wordlines by row controller 1104, for instance.

Figure 12:
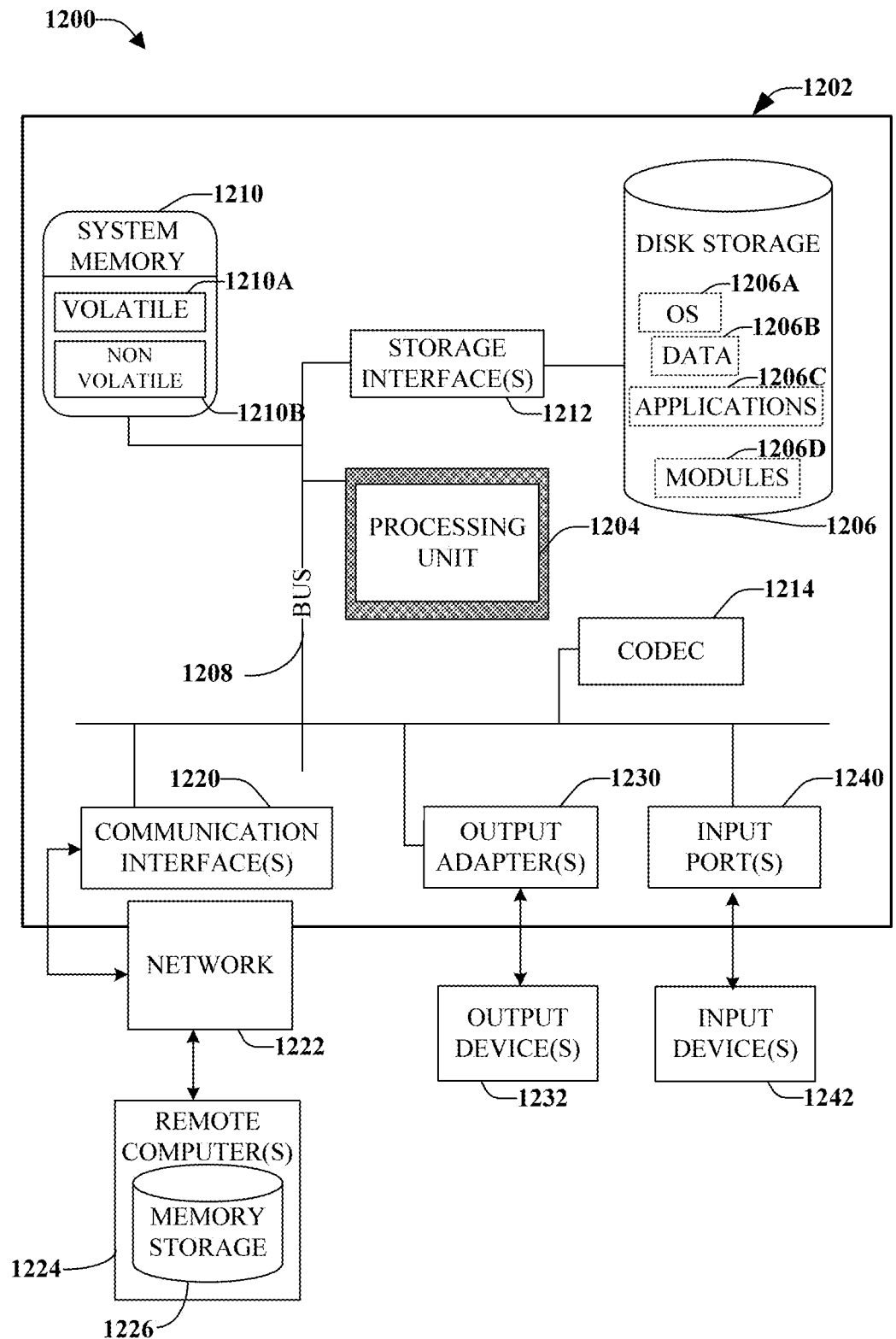
FIG. 12 depicts a block diagram of an example computing environment for implementing one or more disclosed embodiments of the present disclosure.

With reference to FIG. 12, a suitable environment 1200 for implementing various aspects of the claimed subject matter includes a computer 1202. The computer 1202 includes a processing unit 1204, a system memory 1210, a codec 1214, and a system bus 1208. The system bus 1208 couples system components including, but not limited to, the system memory 1210 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1210 includes volatile memory 1210A and non-volatile memory 1210B. The basic input/output system (BIOS), containing the basic routines to transfer information between elements within the computer 1202, such as during start-up, is stored in non-volatile memory 1210B. In addition, according to present innovations, codec 1214 may include at least one of an encoder or decoder, wherein the at least one of an encoder or decoder may consist of hardware, software, or a combination of hardware and software. Although, codec 1214 is depicted as a separate component, codec 1214 may be contained within non-volatile memory 1210B. By way of illustration, and not limitation, non-volatile memory 1210B can include read only memory (ROM), programmable ROM (PROM), electrically programmable ROM (EPROM), electrically erasable programmable ROM (EEPROM), or flash memory, two-terminal memory, and so on. Volatile memory 1210A includes random access memory (RAM), which acts as external cache memory. According to present aspects, the volatile memory may store the write operation retry logic (not shown in FIG. 12) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1202 may also include removable/non-removable, volatile/non-volatile computer storage medium. FIG. 12 illustrates, for example, disk storage 1206. Disk storage 1206 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1206 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1206 to the system bus 1208, a removable or non-removable interface is typically used, such as storage interface 1212. It is appreciated that storage devices 1206 can store information related to a user. Such information might be stored at or provided to a server or to an application running on a user device. In one embodiment, the user can be notified (e.g., by way of output device(s) 1232) of the types of information that are stored to disk storage 1206 or transmitted to the server or application. The user can be provided the opportunity to opt-in or opt-out of having such information collected and/or shared with the server or application (e.g., by way of input from input device(s) 1242).

It is to be appreciated that FIG. 12 describes software that acts as an intermediary between users and the basic computer resources described in the suitable operating environment 1200. Such software includes an operating system 1206A. Operating system 1206A, which can be stored on disk storage 1206, acts to control and allocate resources of the computer system 1202. Applications 1206C take advantage of the management of resources by operating system 1206A through program modules 1206D, and program data 1206D, such as the boot/shutdown transaction table and the like, stored either in system memory 1210 or on disk storage 1206. It is to be appreciated that the claimed subject matter can be implemented with various operating systems or combinations of operating systems.

A user enters commands or information into the computer 1202 through input device(s) 1242. Input devices 1242 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via input port(s) 1240. Input port(s) 1240 include, for example, a serial port, a parallel port, a game port, and a universal serial bus (USB). Output device(s) 1232 use some of the same type of ports as input device(s) 1242. Thus, for example, a USB port may be used to provide input to computer 1202 and to output information from computer 1202 to an output device 1232. Output adapter 1230 is provided to illustrate that there are some output devices 1232 like monitors, speakers, and printers, among other output devices 1232, which require special adapters. The output adapters 1230 include, by way of illustration and not limitation, video and sound cards that provide a means of connection between the output device 1232 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1224. The remote computer(s) 1224 can be a personal computer, a server, a router, a network PC, a workstation, a microprocessor-based appliance, a peer device, a smart phone, a tablet, or other network node, and typically includes many of the elements described relative to computer 1202. For purposes of brevity, only a memory storage device 1226 is illustrated with remote computer(s) 1224. Remote computer(s) 1224 is logically connected to computer 1202 through a network 1222 and then connected via communication interface(s) 1220. Network 1222 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1220 refers to the hardware/software employed to connect the network 1222 to the bus 1208. While communication interface(s) 1220 is shown for illustrative clarity inside computer 1202, it can also be external to computer 1202. The hardware/software necessary for connection to the network 1222 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

Some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g. 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for erasing a memory cell comprises:
applying a first erase process to a first plurality of memory cells to thereby erase each memory cell from the first plurality of memory cells, wherein a second plurality of memory cells from the first plurality of memory cells are in a weakly erased state in response to the first erase process, and wherein a third plurality of memory cells from the first plurality of memory cells are in a normally erased state in response to the first erase process; thereafter
applying a first weak programming process to the first plurality of memory cells that have been erased, wherein memory cells from the second plurality of memory cells are programmed to a programmed state in response to the first weak programming process, and wherein memory cells from the third plurality of memory cells remain in the normally erased state in response to the first weak programming process; thereafter
applying a first read process to the first plurality of memory cells to identify the second plurality of memory cells from the first plurality of memory cells that are in the programmed state in response to the first weak programming process; and
applying a second erase process to the second plurality of memory cells to thereby erase each memory cell from the second plurality of memory cells.

2. The method of claim 1
wherein a fourth plurality of memory cells from the second plurality of memory cells are in the weakly erased state in response to the second erase process;
wherein a fifth plurality of memory cells from the second plurality of memory cells are in the normally erased state in response to the second erase process; and
wherein the method further comprises:
applying a second weak programming process to the second plurality of memory cells that have been erased, wherein memory cells from the fourth plurality of memory cells are programmed to the programmed state in response to the second weak programming process, and wherein memory cells from the fifth plurality of memory cells remain in the normally erased state in response to the second weak programming process; thereafter applying a second read process to the second plurality of memory cells to identify the fourth plurality of memory cells from the second plurality of memory cells that are in the programmed state in response to the second weak programming process.

3. The method of claim 2 further comprising applying a third erase process to the fourth plurality of memory cells to thereby erase each memory cell from the fourth plurality of memory cells.

4. The method of claim 3 wherein a voltage magnitude for the second erase process exceeds a voltage magnitude for the first erase process.

5. The method of claim 2
wherein the first weak programming process is associated with a first voltage magnitude, and a first duration;
wherein the second weak programming process is associated with a second voltage magnitude and a second duration; and
wherein the second voltage magnitude is different than the first voltage magnitude.

6. The method of claim 5 wherein the first voltage magnitude is within a range of about 25% to about 75% of the second voltage magnitude, or wherein the first duration is within a range of about 25% to about 75% of the second voltage duration.

7. A method for erasing a memory cell comprises:
applying a first erase process to the memory cell to thereby erase the memory cell, wherein the memory cell has a weakly erased state or a normally erased state in response to the first erase process; thereafter
applying a first weak programming process to the memory cell that has been erased, wherein the memory cell programs if the memory cell has the weakly erased state, and wherein the memory cell remains erased if the memory cell has the normally erased state; thereafter
applying a first read process to the memory cell to determine whether the memory cell is programmed or is erased; and thereafter
applying a second erase process to the memory cell to thereby erase the memory cell in response to determining the memory cell is programmed.

8. The method of claim 7
wherein the memory cell has the weakly erased state or the normally erased state in response to the second erase process; thereafter
applying a second weak programming process to the memory cell that has been erased, wherein the memory cell programs if the memory cell has the weakly erased state, and wherein the memory cell remains erased if the memory cell has the normally erased state; thereafter
applying a second read process to the memory cell to determine whether the memory cell is programmed or is erased; and thereafter
applying a third erase process to the memory cell to thereby erase the memory cell in response to determining the memory cell is programmed in response to the second weak programming process.

9. The method of claim 8
wherein the first weak programming process is associated with a first voltage magnitude, and a first duration;
wherein the second weak programming process is associated with a second voltage magnitude and a second duration; and
wherein the second voltage magnitude is higher than the first voltage magnitude.

10. The method of claim 9
wherein the first voltage magnitude is within a range of about 25% to about 75% of the second voltage magnitude; or
wherein the first duration is within a range of about 25% to about 75% of the second voltage duration.

11. A memory device comprising:
a first plurality of memory devices, wherein each memory device from the first plurality of memory devices is associated with one state of a plurality of states including a programmed state and an unprogrammed state;
a programming circuit coupled to the first plurality of memory devices,
wherein the programming circuit is configured to apply a regular programming process to the first plurality of memory devices,
wherein the first plurality of memory devices change state from the unprogrammed state to the programmed state in response to the regular programming process,
wherein the programming circuit is also configured to apply a first weak programming process to the first plurality of memory devices,
wherein a second plurality of memory devices from the first plurality of memory devices change state from the unprogrammed state to the programmed state in response to the first weak programming process, and
wherein a third plurality of memory devices from the first plurality of memory devices remain in the unprogrammed state in response to the first weak programming process;
a read circuit coupled to the first plurality of memory devices, wherein the read circuit is configured to apply a read voltage to the first plurality of memory devices to determine memory devices of the second plurality of memory devices that are in the programmed state; and
an erase circuit coupled to the first plurality of memory devices, wherein the erase circuit is configured to apply an erase process to the second plurality of memory devices, wherein the second plurality of memory devices change state from the programmed state to the unprogrammed state, in response to the erase process.

12. The device of claim 11
wherein the regular programming process is associated with a first voltage magnitude, and a first duration;
wherein the first weak programming process is associated with a second voltage magnitude and a second duration; and
wherein the second voltage magnitude is less than the first voltage magnitude.

13. The device of claim 12
wherein the second voltage magnitude is within a range of 25% to 75% of the first voltage magnitude; or
wherein the second duration is within a range of 25% to 75% of the first voltage duration.

14. The device of claim 11 wherein the erase circuit is configured to apply an initial erase process to the first plurality of memory devices to change states of the first plurality of memory devices to the unprogrammed state.

15. The device of claim 11
wherein the regular programming process is associated with a first power consumption;
wherein the first weak programming process is associated with a second power consumption; and
wherein the second power consumption is less than the first power consumption.

16. The device of claim 11
wherein the programming circuit is also configured to apply the regular programming process to the second plurality of memory devices, wherein the second plurality of memory devices change state from the unprogrammed state to the programmed state in response to the regular programming process, wherein the programming circuit is also configured to apply a second weak programming process to the second plurality of memory devices, wherein a subset of memory devices, including the null set, from the second plurality of memory devices change state from the unprogrammed state to the programmed state in response to the second weak programming process, and wherein a third plurality of memory devices from the second plurality of memory devices remain in the unprogrammed state in response to the second weak programming process;
wherein the read circuit is also configured to apply the read voltage to the second plurality of memory devices to determine the subset of memory devices from the second plurality of memory devices, if any, that are in the programmed state; and
wherein the erase circuit is also configured to apply a second erase process to the subset of memory devices determined by the read circuit to be in the programmed state, wherein the subset of memory devices change state from the programmed state to the unprogrammed state, in response to the second erase process.

17. An electronic device comprising:
a programming circuit configured to provide a weak programming signal;
a memory cell coupled to the programming circuit, wherein the memory cell is characterized by a plurality of states comprising a programmed state, a weak unprogrammed state, and a regular unprogrammed state, wherein when in the weak unprogrammed state, the memory cell is configured to enter the programmed state in response to the weak programming signal, and when in the regular unprogrammed state, the memory cell is configured to maintain the regular unprogrammed state in response to the weak programming signal;
a read circuit coupled to the memory cell, wherein the read circuit is configured to apply a read voltage to the memory cell to thereby determine a state of the memory cell; and
an erase circuit coupled to the memory cell, wherein the erase circuit is configured to apply a first erase signal to the memory cell to cause the memory cell to change state from the programmed state to the weak unprogrammed state.

18. The electronic device of claim 17
wherein the programming circuit is also configured to provide a regular programming signal, wherein the regular programming signal is associated with a first voltage magnitude, and a first duration;
wherein the weak programming signal is associated with a second voltage magnitude and a second duration; and
wherein the second voltage magnitude is less than the first voltage magnitude.

19. The electronic device of claim 18
wherein the second voltage magnitude is within a range of 25% to 75% of the first voltage magnitude; or
wherein the second duration is within a range of 25% to 75% of the first voltage duration.

20. The electronic device of claim 17
wherein the first erase signal is associated with a first voltage magnitude;
wherein the erase circuit is also configured to apply a second erase signal to the memory cell to cause the memory cell to change state from the programmed state to the regular unprogrammed state, and wherein the second erase signal is associated with a second voltage magnitude; and
wherein the second voltage magnitude exceeds the first voltage magnitude.

* * * * *